US008848382B2

(12) United States Patent  
Qiu et al.

(10) Patent No.: US 8,848,382 B2  
(45) Date of Patent: Sep. 30, 2014

(54) CHASSIS AND DATA ACCESS MODULE HAVING THE SAME

(75) Inventors: Hai-Nan Qiu, Kunshan (CN); Chia-Hsin Hsieh, New Taipei (TW)

(73) Assignee: Wistron Corp., New Taipei (TW)

( * ) Notice: Subject to any disclaimer, the term of this patent is extended or adjusted under 35 U.S.C. 154(b) by 263 days.

(21) Appl. No.: 13/620,489

(22) Filed: Sep. 14, 2012

(65) Prior Publication Data

US 2013/0258620 A1    Oct. 3, 2013

(30) Foreign Application Priority Data

Mar. 30, 2012  (CN) .......................... 2012 1 0095974

(51) Int. Cl.  
*H05K 5/00* (2006.01)

(52) U.S. Cl.  
USPC ........... 361/753; 361/724; 361/725; 361/726; 361/728; 361/730; 361/679.33

(58) Field of Classification Search  
CPC ......... G06F 1/184; G06F 1/185; G06F 1/186; H05K 9/0007; H05K 5/0269; H05K 13/0069  
USPC ............ 361/753, 759, 679.33, 724, 725, 726, 361/730, 679.01, 679.02  
See application file for complete search history.

(56) References Cited

U.S. PATENT DOCUMENTS

| 6,819,567 | B2 * | 11/2004 | Baker et al. | 361/724 |
| 7,554,811 | B2 * | 6/2009 | Scicluna et al. | 361/725 |
| 7,889,490 | B2 * | 2/2011 | Chen et al. | 361/679.33 |
| 8,014,144 | B2 * | 9/2011 | Cheng et al. | 361/679.33 |
| 8,534,628 | B2 * | 9/2013 | Lu | 248/309.1 |

FOREIGN PATENT DOCUMENTS

| TW | M325712 | | 1/2008 |
| TW | M386519 | U1 | 8/2010 |
| TW | M421677 | U1 | 1/2012 |

OTHER PUBLICATIONS

Taiwan Patent Office, Office Action issued on Jan. 6, 2014.

* cited by examiner

*Primary Examiner* — Robert J Hoffberg  
*Assistant Examiner* — Hung Dang  
(74) *Attorney, Agent, or Firm* — Li & Cai Intellectual Property (USA) Office

(57) ABSTRACT

The instant disclosure relates to a data access module, which includes a plurality of data access devices, a circuit board defining a plurality of holes, a base frame, a plurality of partition panels, a cover frame, and a plurality of locking pieces. The base frame includes a bottom plate and a pair of sidewalls. A plurality of fixing pieces and ridges are formed on the bottom plate. The partition panels are directed along the retrieving direction of the data access devices and fixed on the bottom plate. Each partition panel has a hooking portion for engaging the corresponding hole of the circuit board. The cover frame includes a top plate and a pair of side plates. The locking pieces are rotatably disposed on the cover frame. Each locking piece has a pressing portion selectively pressing against the circuit board. A chassis is also discussed.

20 Claims, 7 Drawing Sheets

CHASSIS AND DATA ACCESS MODULE HAVING THE SAME

BACKGROUND OF THE INVENTION

1. Field of the Invention

The instant disclosure relates to a chassis and a data access module having the same; more particularly, to a chassis for securing and protecting a circuit board and a data access module having the same for using with a server device for mass data storage application.

2. Description of Related Art

A server device is typically constructed of hard disk drives working selectively with optical disk drives. A circuit board is utilized for connecting electrically to these data access devices. Related U.S. patents are published as U.S. Pat. Nos. 7,889,490B2 and 8,014,144B2.

Circuit boards used for server devices typically have a strip-like shape. These circuit boards have a certain thickness rendering them less easy to secure inside a chassis. In addition, when mounting or dismounting the hard disks, the exerted force may easily loosen the circuit board. Thus, during the assembling process and operating stage of the server device, the circuit board may be easily damaged.

The instant disclosure addresses the abovementioned issues by providing a chassis that effectively secure and protect the internal circuit board in a confined space.

SUMMARY OF THE INVENTION

The object of the instant disclosure is to provide a chassis and a data access module. The chassis is capable of securing the strip-shaped circuit board effectively for protection purpose and ensuring uninterrupted electrical connection between the circuit board and the data access devices.

The other object of the instant disclosure is to provide a chassis and a data access module for simplifying the installing/dismounting procedures of the circuit board to save the assembling/disassembling time.

The chassis of the instant disclosure is utilized for securing a circuit board and accommodating at least one data access device. The data access device is normally connected to the circuit board. The circuit board defines at least one hole. The chassis comprises a base frame, at least one partition panel, a cover frame, and at least one locking piece. The base frame includes a bottom plate and a pair of sidewalls secured to opposite sides thereof. The bottom plate has at least one fixing piece and at least ridge formed thereon. The fixing piece and the ridge retain opposite sides of the circuit board. The partition panel is directed along a direction of retrieving the data access device and fixed on the bottom plate. The partition panel has a hooking portion. The hooking portion is formed by extending longitudinally and protrudes upwardly for engaging the hole of the circuit board. The cover frame has a top plate and a pair of side plates connected to opposite sides thereof. The side plates are arranged in close to the sidewalls of the base frame. The locking piece is rotatably disposed on the top plate of the cover frame. The locking piece has a pressing portion selectively pressing against a top edge of the circuit board.

The data access module of the instant disclosure comprises a plurality of data access devices, a circuit board, a base frame, a plurality of partition panels, a cover frame, and a plurality of locking pieces. The circuit board defines a plurality of holes. The data access devices are normally connected to the circuit board. The base frame includes a bottom plate and a pair of sidewalls secured to opposite sides thereof. The bottom plate has a plurality fixing pieces and ridges formed thereon. The fixing pieces and the ridges retain opposite sides of the circuit board. The partition panels are directed along the direction of retrieving the data access devices and fixed on the bottom plate. Each partition panel has a hooking portion. The hooking portion is formed by extending longitudinally and protrudes upwardly for engaging the corresponding hole of the circuit board. The cover frame has a top plate and a pair of side plates connected to opposite sides thereof. The side plates are arranged in close to the sidewalls of the base frame. The locking pieces are rotatably disposed on the top plate of the cover frame. Each locking piece has a pressing portion selectively pressing against a top edge of the circuit board.

The instant disclosure has the following advantages. Namely, the circuit board is secured and protected cooperatively by the base frame, the partition panel, and the cover frame. Thus, the circuit board is secured substantially in all directions. In addition, by turning the locking pieces, the circuit board may be locked or unlocked in a simplified manner.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE EMBODIMENT

Figure 1:
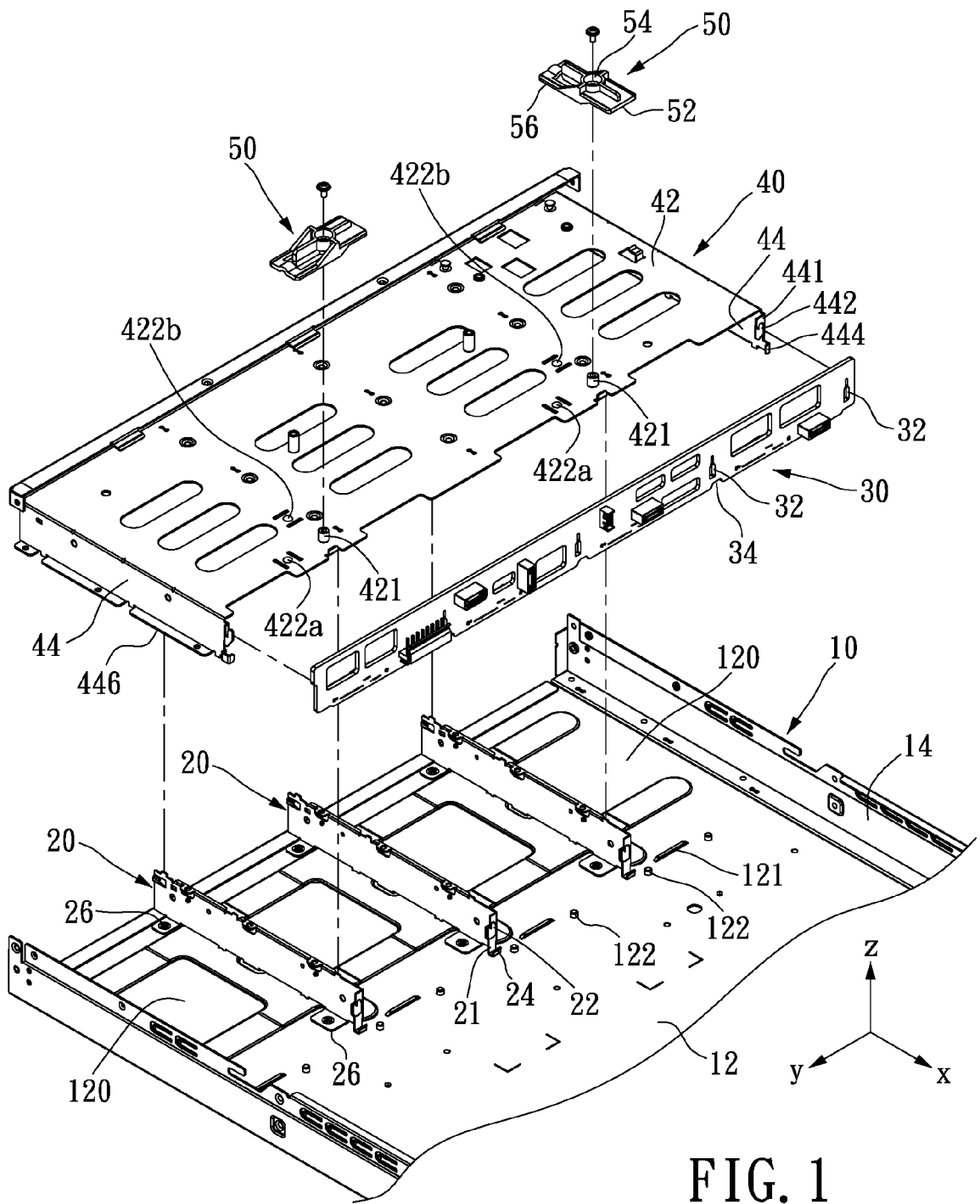
FIG. 1 is an exploded view of a chassis with a circuit board of the instant disclosure.
Figure 2:
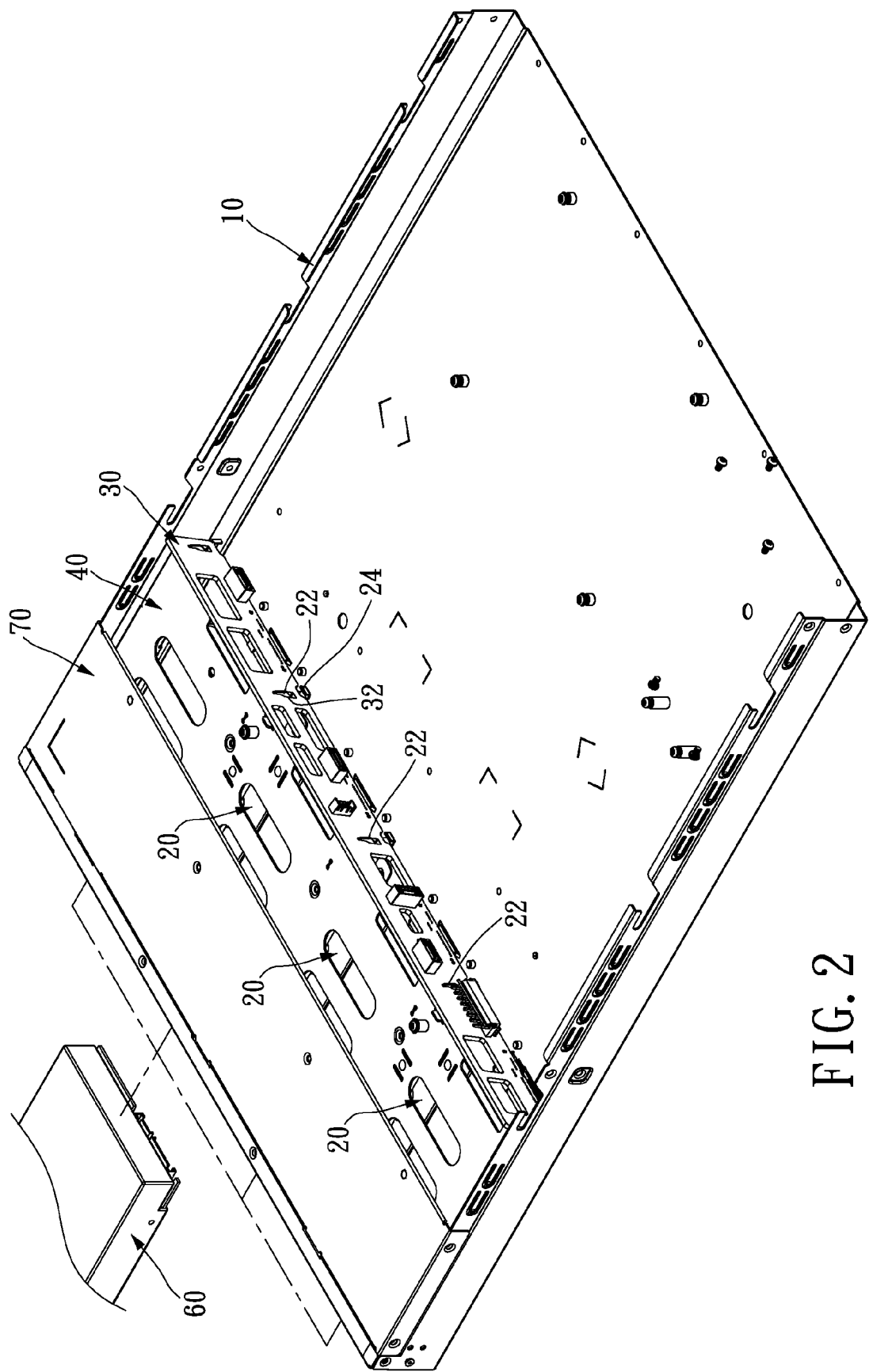
FIG. 2 is an assembled view of the chassis of the instant disclosure.

Please refer to FIGS. 1 and 2, which show a chassis of the instant disclosure. The chassis firmly secures and protects an elongated circuit board.

The chassis of the instant disclosure comprises a base frame 10, a plurality of partition panels 20, a circuit board 30, a cover frame 40, and a plurality of locking pieces 50. The partition panels 20 are fixed parallelly on the base frame 10 and define a plurality of receiving spaces 120. The receiving spaces 120 are utilized for accommodating a plurality of data access devices 60, such as hard disks. The data access devices 60 are connected perpendicularly to the circuit board 30. The cover frame 40 and the base frame 10 have substantially the same width. The cover frame 40 is arranged on top of the partition panels 20. The above described chassis is utilized for securing the circuit board 30 that is normally mounted on the base frame 10. The circuit board 30 defines a plurality of holes 32 and has a plurality of electrical interfaces (not labeled) for connecting to other electronic devices.

FIG. 2 is an assembled view of the chassis of the instant disclosure. The assembling process begins by disposing the partition panels 20 and the cover frame 40 on the base frame 10. Then, an outer cover 70 is laid on the cover frame 40. Next, the circuit board 30 is inserted at an angle on the base frame 10. Then, the circuit board 30 is tilted toward the partition panels 20 and moved downward to abut the base frame 10. Thus, the circuit board 30 is secured cooperatively by the base frame 10, the partition panels 20, and the cover frame 40. The unoccupied space defined by the base frame 10 may be saved for accommodating a motherboard, a power supply module, a cooling fan, etc. The above described configuration may be used for a data access module of a server device.

Figure 3:
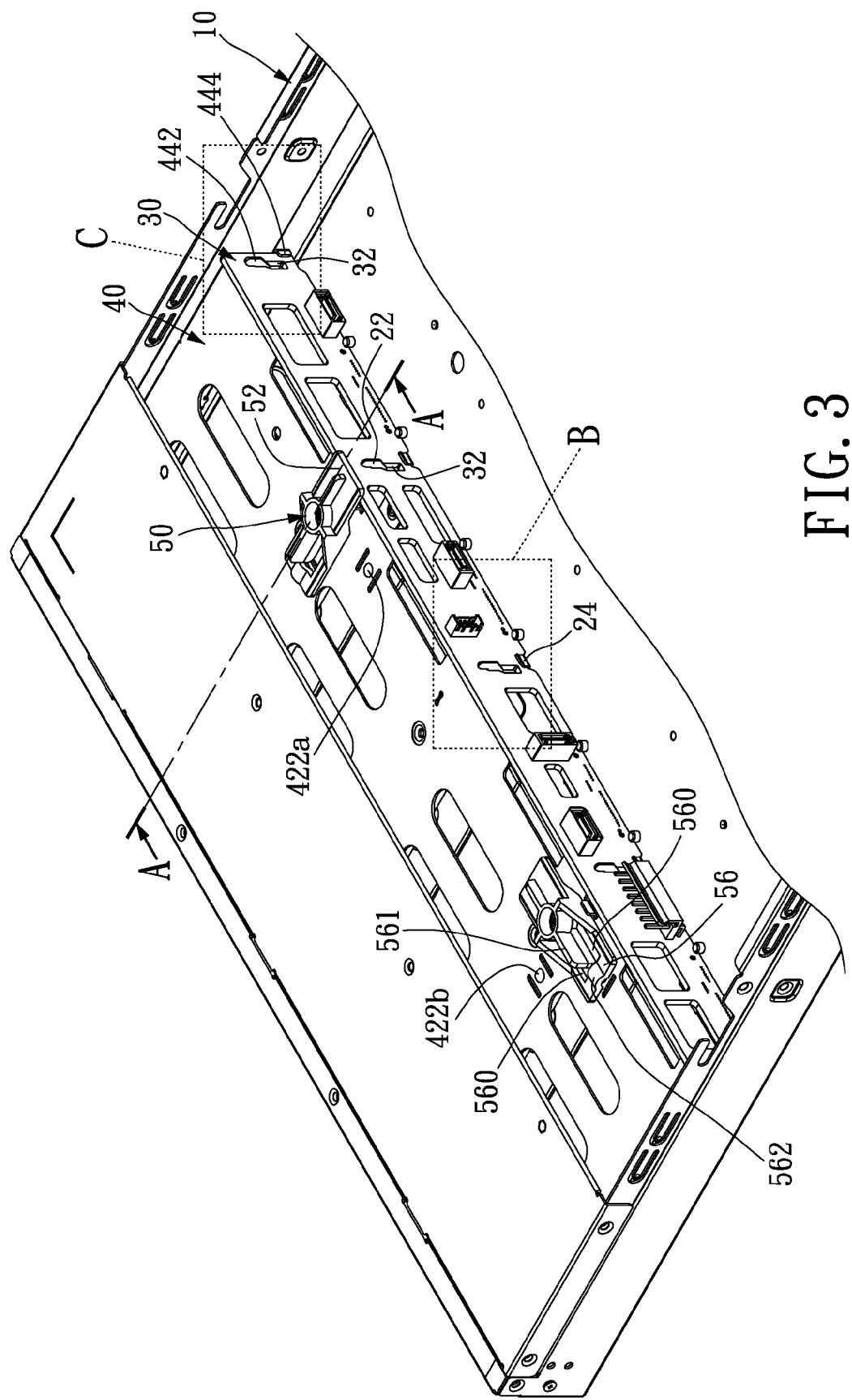
FIG. 3 is a partial view of the chassis of the instant disclosure.
Figure 3A:
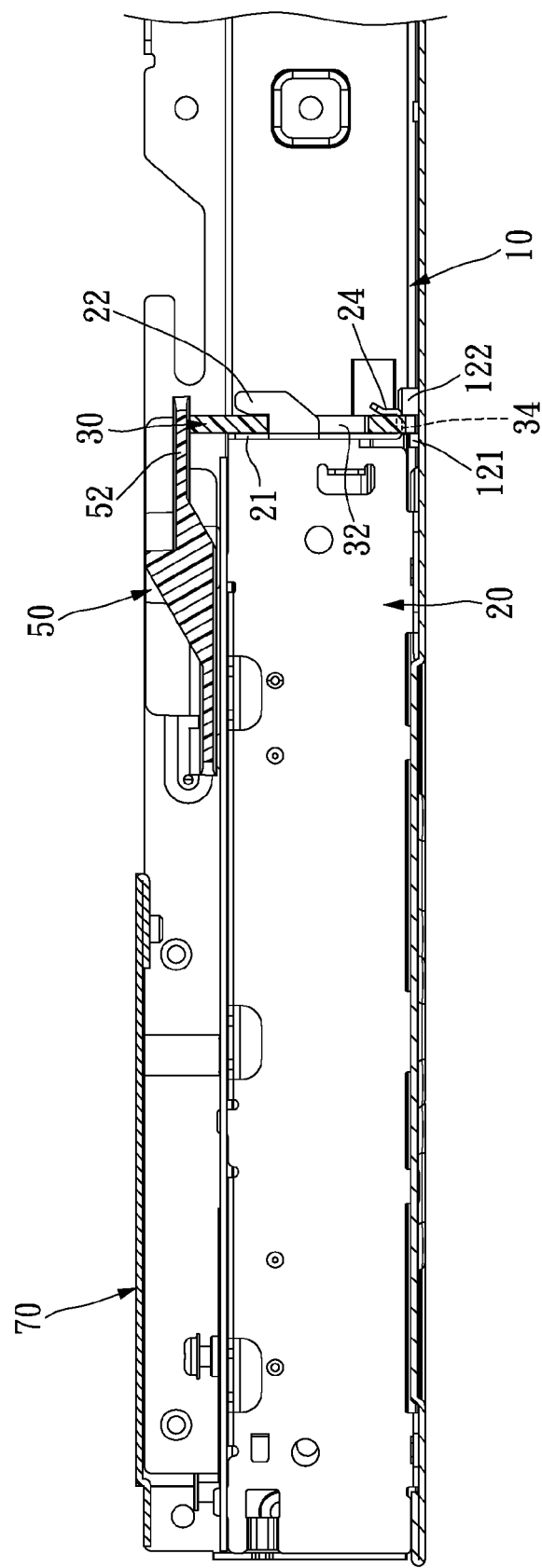
FIG. 3A is a cross-sectional view of FIG. 3 taken along a cut-line AA.
Figure 4:
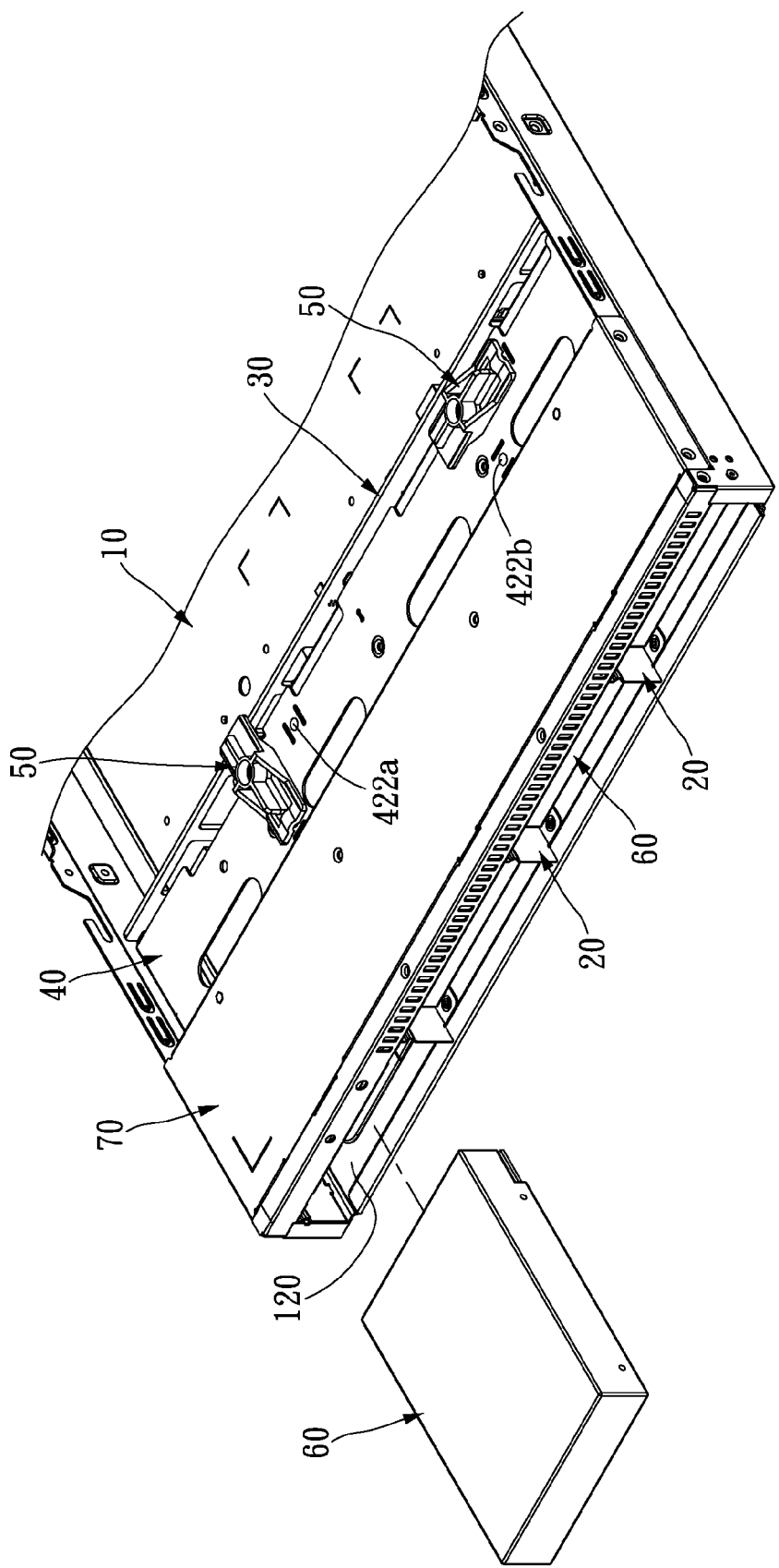
FIG. 4 is a partial view of the chassis of the instant disclosure.

FIGS. 3 and 4 show other assembled views of the chassis of the instant disclosure. The instant embodiment is based on 1U rackmount server having a chassis and four hard disk drive bays. When the instant disclosure is applied to a rackmount server, the circuit board 30 is adequately protected inside the chassis. The improved security of the circuit board 30 ensures proper electrical connection between the hard disks and the circuit board 30. However, the applicability of the instant disclosure is not restricted to the server device. Detailed description of each component of the instant disclosure is provided hereinbelow.

Figure 3B:
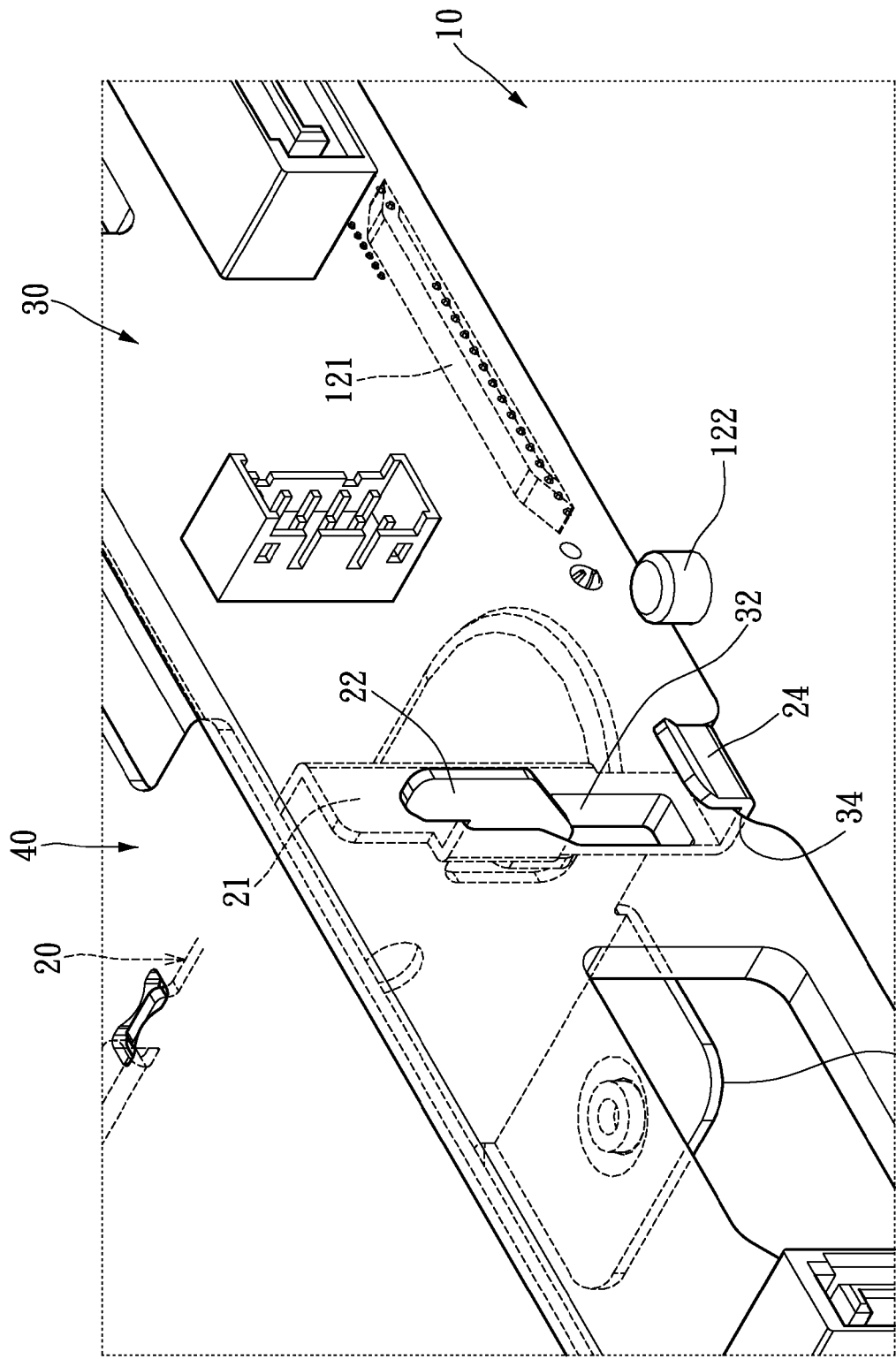
FIG. 3B is an enlarged view of region B in FIG. 3.

Please refer back to FIG. 1. The base frame 10 includes a bottom plate 12 and a pair of sidewalls 14 connected to opposite sides thereof. For the instant embodiment, the sidewalls 14 are secured to the bottom plate 12 by rivets. However, the sidewalls 14 may be bent from the bottom plate 12 as a one-piece unit. The outer surfaces of the sidewalls 14 may be fitted with guide rails (not shown). The bottom plate 12 has a plurality of fixing pieces 122 and ridges 121 formed thereon. The fixing pieces 122 and the ridges 121 retain the circuit board 30 by abutting to opposite sides thereof, as shown in FIG. 3B. Thus, the chassis, in particular the base frame 10, prevents the circuit board 30 from displacing along the horizontal direction. The horizontal direction is defined as the direction for retrieving the data access devices 60 represented by the x-axis in FIG. 1.

For the instant embodiment, every ridge 121 is paired up with two fixing pieces 122 as a structural unit for securing the bottom edge of the circuit board 30. The two fixing pieces 122 are arranged on opposite sides of the corresponding ridge 121. For the instant embodiment, the fixing pieces 122 are tubular. Preferably, the fixing pieces 122 may be rivet-like fastening members, which can be easily secured to the base frame 10. The ridges 121 are formed by stamping. For example, a portion of the bottom plate 12 is subjected to punching to form arch-like structures.

Please refer to FIGS. 1 and 3B. The partition panels 20 are directed along the direction of retrieving the data access devices 60 and fixed on the bottom plate 12. Each partition panel 20 has a hooking portion 22 formed longitudinally and extends upwardly for engaging the corresponding hole 32 of the circuit board 30. A plurality of mounting feet 26 bendingly extends from the bottom edge of each partition panel 20. The mounting feet 26 secure the partition panels 20 to the bottom plate 12 of the base frame 10. Each partition panel 20 further has a retaining portion 24 formed near the bottom edge thereof for engaging the bottom edge of the circuit board 30. More specifically, each partition panel 20 has a transition portion 21 extending parallely with the circuit board 30 and is arranged in close to the corresponding hole 32. The hooking portion 22 bendingly extends from the transition portion 21 in a direction toward the circuit board 30. The retaining portion 24, which is U-shaped, is formed by bendingly extends from the bottom edge of the transition portion 21 in a direction toward the circuit board 30. The transition portion 21 also increases the surface area of the corresponding partition panel 20 for supporting the circuit board 30.

As shown in FIG. 3B, each hole 32 of the circuit board 30 has a beer bottle-like shape. In other words, the hole 32 is wide at the bottom and narrower at the top. This configuration allows the hooking portion 22 of the partition panel 20 to easily engage the corresponding hole 32 of the circuit board 30 in a bottom-to-top motion. In addition, the circuit board 30 has a plurality of notches 34 formed along the bottom edge thereof for engaging by the retaining portions 24. The above described construction prevents the circuit board 30 from displacing along the x-axis.

Figure 3C:
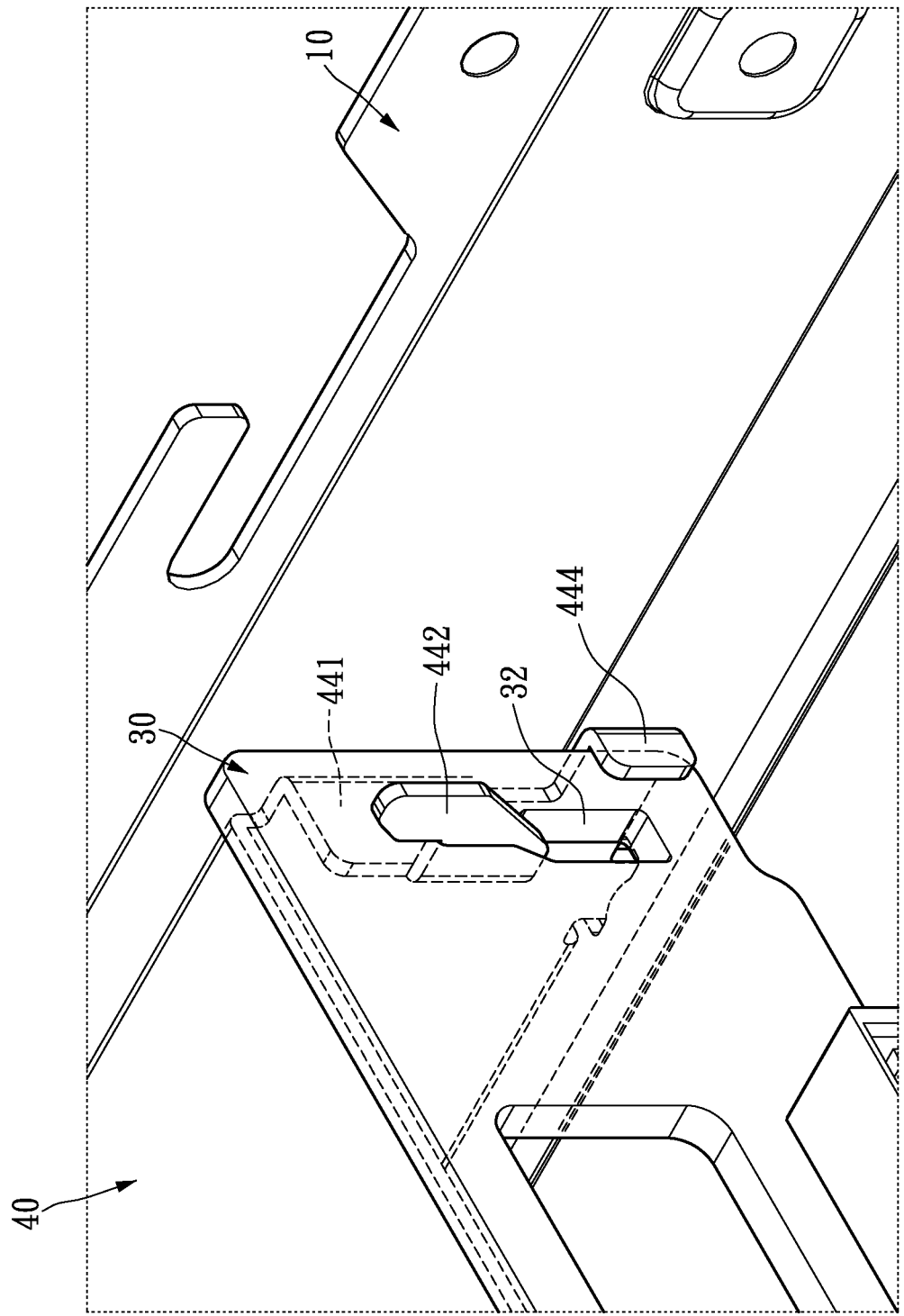
FIG. 3C is an enlarged view of region C in FIG. 3.

Please refer back to FIG. 1. The cover frame 40 includes a top plate 42 and a pair of side plates 44 connected to opposite sides thereof. The side plates 44 are arranged in close to the sidewalls 14 of the base frame 10. Each side plate 44 has at least one lip portion 446 extending from the bottom edge thereof for fixing to the bottom plate 12. The top plate 42 and the bottom plate 12 have substantially the same width, and the top plate 42 and the partition panels 20 have substantially the same length. Please refer to FIG. 3C in conjunction with FIG. 1. The side plates 44 are similar to the partition panels 20 structurally. Namely, each side plate 44 has a transition portion 441 bendingly extends from one side thereof and abuts parallely to the circuit board 30, a hooking portion 442 bendingly extends from the transition portion 441 in a direction toward the circuit board 30 and engages the corresponding hole 32, and a stopping portion 444 bendingly extends from the transition portion 441 in a direction toward the circuit board 30. The stopping portion 444 is formed below the hooking portion 442 and holds the corresponding edge of the circuit board 30. Through the above described construction, the circuit board 30 is prevented from displacing along the x and y axes and toward the negative z-axis direction.

Please refer again to FIGS. 1 and 3. The locking pieces 50 are rotatably disposed on the upper surface of the cover frame 40 and above the partition panels 20. Each locking piece 50 has a pressing portion 52 selectively pressing against the circuit board 30. For each locking piece 50, a mounting seat 421 and a pair of restrictors 422a, 422b are formed correspondingly on the cover frame 40. The restrictor 422a is arranged in close to the circuit board 30, while the other restrictor 422b is arranged away from the circuit board 30. Each locking piece 50 has a connecting portion 54 rotatably connected to the mounting seat 421 by a screw and a locking portion 56 selectively engages the restrictor 422a, 422b. The pressing portion 52 and the locking portion 56 are formed on opposite sides of the connecting portion 54. The locking portion 56 defines an arch-shaped cavity 562 selectively engages one of the restrictors 422a, 422b. For the instant embodiment, the locking portion 56 further has a flexible arm member 561 and defines a pair of openings 560 formed on opposite sides of the arm member 561. The arm member 561 is connected to the cavity 562 to enhance the overall maneuverability of the locking piece 50.

When the locking portion 56 of the locking piece 50 is fixed on the restrictor 422a, the locking piece 50 is substantially parallel to the circuit board 30 and is oriented at the unlocked position. This configuration is illustrated by the locking piece 50 shown on the left side of FIG. 3. At this unlocked position, the circuit board 30 may be removed. In contrary, when the locking portion 56 of the locking piece 50 is engaged to the restrictor 422b, the locking piece 50 is normal to the circuit board 30 and is oriented at the locked position. This configuration is illustrated by the locking piece 50 shown on the right side of FIG. 3. At the locked position, the circuit board 30 is prevented from displacing upward (i.e., along the positive z-axis) by the locking piece 50. Thus, the circuit board 30 may be easily maintained and replaced.

Based on the foregoing, the chassis and data access module of the instant disclosure have the following advantages. The chassis is self-capable in securing the circuit board without extra parts in saving manufacturing cost. The circuit board can be adequately secured by the base frame, the partition panels, and the cover frame. In addition, the use of the locking pieces in preventing upward displacement by the circuit board simplifies the procedure in installing/dismounting the circuit board. The overall assembling time of the server device may be shortened.

The descriptions illustrated supra set forth simply the preferred embodiment of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A chassis, for securing a circuit board and receiving at least one data access device, with the data access device connected perpendicularly to a major surface of the circuit board, the circuit board defining at least one hole, comprising:
a base frame including a bottom plate and a pair of sidewalls connected to the opposite sides thereof, at least one fixing piece and at least one ridge being formed on the bottom plate for retaining opposite sides of the circuit board;
at least one partition panel directed along a direction for retrieving the data access device and fixed on the bottom plate, the partition panel having a hooking portion extending longitudinally and upwardly for engaging the hole;
a cover frame including a top plate and a pair of side plates connected to opposite sides thereof, the side plates being arranged in close to the sidewalls of the base frame; and
at least one locking piece rotatably disposed on an upper surface of the top plate, the locking piece having a pressing portion selectively pressing against the circuit board.

2. The chassis of claim 1, wherein a plurality of mounting feet bendingly extends from a bottom edge of the partition panel for securing to the bottom plate of the base frame.

3. The chassis of claim 1, wherein the partition panel has a retaining portion near the bottom edge thereof for retaining the circuit board.

4. The chassis of claim 3, wherein the circuit board has a notch for engaging by the retaining portion.

5. The chassis of claim 4, wherein the partition panel has a transition portion extending generally parallel with the circuit board near the hole, wherein the hooking portion bendingly extends toward the circuit board from the transition portion, and wherein the retaining portion bendingly extends from the transition portion into U-shape under the hooking portion.

6. The chassis of claim 1, wherein the side plates of the cover frame each has a transition portion parallely abuts to the circuit board, a hooking portion extends toward the circuit board from the transition portion for engaging the hole, and a stopping portion bent from the transition portion toward the circuit board and under the hooking portion for retaining the circuit board.

7. The chassis of claim 1, wherein a mounting seat and at least one restrictor are formed on the cover frame, and wherein the locking piece has a connecting portion rotatably connected to the mounting seat and a locking portion selectively engaged to the restrictor, and wherein the pressing portion and the locking portion are arranged on opposite sides of the connecting portion.

8. The chassis of claim 7, wherein the locking portion defines an arch-shaped cavity selectively engaged by the restrictor, and wherein the locking portion further has a flexible arm member connected to the cavity and defines a pair of openings on opposite sides of the flexible arm member.

9. The chassis of claim 1, wherein the fixing piece is tubular.

10. The chassis of claim 1, wherein the ridge is formed by punching into arch-like shape.

11. A data access module, comprising:
a plurality of data access devices;
a circuit board defining a plurality of holes and a major surface of the circuit board perpendicularly connected by the data access devices;
a base frame including a bottom plate and a pair of sidewalls connected to the opposite sides thereof, a plurality of fixing pieces and ridges being formed on the bottom plate for retaining opposite sides of the circuit board;
a plurality of partition panels directed along a direction for retrieving the data access devices and fixed on the bottom plate, each partition panel having a hooking portion extending longitudinally and upwardly for engaging the corresponding hole;
a cover frame including a top plate and a pair of side plates connected to opposite sides thereof, the side plates being arranged in close to the sidewalls of the base frame; and
a plurality of locking pieces rotatably disposed on an upper surface of the top plate, each locking piece having a pressing portion selectively pressing against the circuit board.

12. The data access module of claim 11, wherein a plurality of mounting feet bendingly extends from a bottom edge of each partition panel for securing to the bottom plate of the base frame.

13. The data access module of claim 11, wherein each partition panel has a retaining portion near the bottom edge thereof for retaining the circuit board.

14. The data access module of claim 13, wherein the circuit board has at least one notch for engaging by the retaining portion.

15. The data access module of claim 14, wherein each partition panel has a transition portion extending generally parallel with the circuit board near the corresponding hole, wherein the hooking portion bendingly extends toward the circuit board from the transition portion, and wherein the retaining portion bendingly extends from the transition portion into U-shape under the hooking portion.

16. The data access module of claim 11, wherein the side plates of the cover frame each has a transition portion parallely abuts to the circuit board, a hooking portion extends toward the circuit board from the transition portion for engaging the corresponding hole, and a stopping portion bent from the transition portion toward the circuit board and under the hooking portion for retaining the circuit board.

17. The data access module of claim 11, wherein a mounting seat and at least one restrictor are formed on the cover frame, and wherein the locking piece has a connecting portion rotatably connected to the mounting seat and a locking portion selectively engaged to the restrictor, and wherein the pressing portion and the locking portion are arranged on opposite sides of the connecting portion.

18. The data access module of claim 17, wherein the locking portion defines an arch-shaped cavity selectively engaged by the restrictor, and wherein the locking portion further has a flexible arm member connected to the cavity and defines a pair of openings on opposite sides of the flexible arm member.

19. The data access module of claim 11, wherein the fixing pieces are tubular.

20. The data access module of claim 11, wherein the ridges are formed by punching into arch-like shape, and the locking pieces are disposed above the partition panels.

* * * * *